(12) United States Patent
Patra et al.

(10) Patent No.: US 6,516,383 B1
(45) Date of Patent: Feb. 4, 2003

(54) TECHNIQUES FOR EFFICIENT LOCATION OF FREE ENTRIES FOR TCAM INSERTS

(75) Inventors: Abhijit Patra, Santa Clara, CA (US); Rina Panigrahy, Sunnyvale, CA (US); Samar Sharma, Sunnyvale, CA (US)

(73) Assignee: Cisco Technology, Inc., San Jose, CA (US)

( * ) Notice: Subject to any disclaimer, the term of this patent is extended or adjusted under 35 U.S.C. 154(b) by 42 days.

(21) Appl. No.: 09/871,321

(22) Filed: May 30, 2001

(51) Int. Cl.$^7$ .............................................. G06F 12/00
(52) U.S. Cl. ......................................... 711/108; 365/49
(58) Field of Search ............................ 711/108; 380/28; 365/49

(56) References Cited

U.S. PATENT DOCUMENTS

| | | | | |
|---|---|---|---|---|
| 5,841,874 A | * | 11/1998 | Kempke et al. | 380/50 |
| 6,081,440 A | | 6/2000 | Washburn et al. | 365/49 |
| 6,374,326 B1 | * | 4/2002 | Kansal et al. | 711/108 |

* cited by examiner

*Primary Examiner*—Do Hyun Yoo
*Assistant Examiner*—Nasser Moazzami
(74) *Attorney, Agent, or Firm*—Campbell Stephenson Ascolese, LLP; Samuel G. Campbell, III

(57) ABSTRACT

Techniques for the efficient location of free entries for use in performing insert operations in a binary or ternary content addressable memory. As used in data communications and packet routing, such memories often rely on an organization that maintains entries of the same "length" within defined regions. The present invention keeps the free entries (holes) compacted into a contiguous subregion within each region, without requiring hole movement during deletes. These positive effects are accomplished by initially pre-filling the entire memory with a set of hole codes that each uniquely identify the holes in each region. A conventional memory write is then performed to load routing data into the memory. Typically, such routing information will not fill the entire memory, leaving unused entries (containing the region appropriate hole code) in each region. As entries need to be deleted, they are simply replaced by writing in the region-unique hole code. To insert an entry, the host processor searches for the desired region-unique hole and writes the data to its location. In instances where a region has no available holes, a mechanism is presented to move a hole from a nearby region.

24 Claims, 8 Drawing Sheets

TECHNIQUES FOR EFFICIENT LOCATION OF FREE ENTRIES FOR TCAM INSERTS

BACKGROUND OF THE INVENTION

1. Field of the Invention

The present invention relates to memory management schemes for use in data communications, specifically packet routing.

2. Description of the Related Art

Within routers and switches today, the process whereby the routing function is carried out is well known in the art. Part of that process is the step of determining whether or not a router is aware of the corresponding next hop destination for packet routing. This typically uses a lookup of certain elements of the packet or cell header in a table to determine packet routing, such as a longest Internet Protocol (IP) prefix match for a destination address derived from the packet header. Many systems exist for determining such matches, both in the context of Internet Protocol routing as well as other forms of routing and switching (such as those employed with the asynchronous transfer mode [ATM] communications). See for example, U.S. Pat. No. 5,809,501 to Noven, entitled *Method and System of Database Management and an Asynchronous Transfer Mode (ATM) Environment* and U.S. Pat. No. 5,884,297 also to Noven, entitled *System and Method for Maintaining a Table in Content Addressable Memory Using Hole Algorithms*. Both of these patents are incorporated herein by reference in their entireties.

As is well-known in the art, a content addressable memory (CAM) lookup outputs an exact match: either the parameter to be looked up (i.e., the lookup key) is in the CAM table or it is not. If the key is found in the table, an exact match exists and the address in the CAM table where the entry was found is provided as the output of the lookup. Ternary CAMs (TCAMs) differ from CAMs in that a TCAM allows the user to mask off bits such that a lookup key is said to match a TCAM entry even if all bits in the key do not match the entry. In other words, by masking out certain bits in the TCAM as "don't care" bits, more than one lookup key can be said to match a TCAM entry. If several TCAM entries match the lookup key, the top-most one (i.e., the entry having the lowest address) is returned. This feature is useful in supporting the longest IP prefix lookup function because the object of the search is only to find the longest prefix match, not to find all exact matches of the entire key. Commonly, the mask function of the TCAM is used to remove (mask off) non-prefix bits in the TCAM so that the lookup speed is increased in a longest prefix match lookup.

Longest prefix lookups are commonly implemented using a TCAM by placing the prefix entries in the TCAM in descending order, sorted by the length of the prefix in each entry. FIG. 1 illustrates a prior art TCAM-implemented lookup table 100 containing sorted prefix entries 110. The non-prefix bits of the IP address in the TCAM are generally masked off at the time of lookup. For Internet Protocol version 4 (IPv4), the IP addresses are 32 bits long: sorting these addresses into a TCAM thus creates a table having 32 different regions (not shown), where each region 1 consists of entries of a prefix length i, i being the number of unique prefix bits in an entry. (Note that in the upcoming standard Internet Protocol version 6 (IPv6), the IP address is 128 bits. IPv6 will thus necessitate a TCAM having 128 distinct IP prefix length regions.)

FIG. 1 shows a representative prior art TCAM containing a number of entries 110. Entries 110 that are empty (i.e., not having a prefix stored therewithin) are labeled as "holes" 120. (Entries having a prefix stored therewithin are labeled "130".) The highest address entry is 110-A, here containing a prefix 130. The lowest address entry (in the bottom-most position) in TCAM table 100 is 110-Z, here containing a hole 120.

Although a TCAM addressing scheme having the lowest address at the "bottom" of the memory array is described, those skilled in the art will realize that such an organization is merely conceptual and that other conceptualizations and/or physical content-addressable memory layouts can be used. Accordingly, the present invention is not limited to any particular address ordering. Both the "lowest address on top" and "lowest address on bottom" orderings can be used with appropriate adaptations of the methods and apparatus described herein. Such adaptation is well within the skill of one of ordinary skill in the art and requires no undue experimentation.

Furthermore, FIG. 1 is only a representative illustration of a portion of a TCAM configured for longest prefix match lookups. One of ordinary skill in the art will readily understand that TCAMs, and CAMs generally, having widths greater than 32 bits are commonly used and that the "depth" (i.e., the number of available entries) of the TCAM can vary.

In operation, lookup key 105 is compared to every entry 110 in TCAM 100. The comparison of key 105 to all entries in TCAM 100 is done simultaneously by a bit-wise NOT (XOR) with every unmasked bit in every entry. If an AND function of the results of all of the NOT(XOR) operations for an entry 110 is TRUE, the all bits of that entry 110 match key 105. The address of the highest addressed (and therefore longest prefix) entry is provided to the TCAM output.

Although the ability of the TCAM to rapidly produce longest prefix lookup matches is advantageous, it complicates the task of inserting and deleting new prefixes within the TCAM table. This is so because the TCAM table must be maintained in a prefix length sorted order. Though TCAM updates (inserts and deletes) are infrequent, a time consuming update mechanism steals valuable processor resources and potentially results in a dropping of packets. Such deleterious effects must be avoided if high packet switching/routing speeds are to be maintained. The problem is only exacerbated by the expected industry switch to the IPv6 architecture with its longer addresses.

An insert of a prefix of length i can be accomplished in one TCAM write cycle if there is a vacant entry (hole) in the $i^{th}$ region (i.e., the region containing all entries of equal length i), otherwise the TCAM write may need to move a vacant entry from a neighboring region in order to expand the space in the $i^{th}$ region. In particular, if up to k regions on either side of the $i^{th}$ region have no holes, then one would need to perform k moves to provide a hole. Since the cost of a move (involving both reading and writing the entry) is much higher than that of a lookup, it is desirable to minimize the number of moves involved in TCAM updates.

In one prior art method commonly used, a "naïve" algorithm for TCAM updates is employed. The naïve (or "lazy") algorithm moves TCAM entries only when it needs to. A delete in a given region creates a hole in that region. Conversely, an insert in a region requires the presence of a hole in that region in which to insert the entry. A region is referred to as a "full" (or "congested") region when it does not have any holes and thus an insert into a full region requires moving a hole into that region from the nearest non-full region. This may necessitate moving entries in adjoining regions as well, in order to make room. It is desirable that the number of moves required to supply a hole to a full region is minimized. Indeed, it is preferable to have some holes in each region to facilitate updating.

Consider a TCAM with a certain maximum number of entries. One can readily see that some routing applications could use enough IP prefixes to result in a TCAM occupancy rate of 90% or more. In fact, such occupancy rates are commonly seen in the art today. A 90% occupancy rate implies that 10% of the TCAM entries are holes. A "good distribution" of these holes is one where they are almost equally distributed among the 32 regions (in an IPv4 system, which has a maximum prefix length of 32 bits) so that one does not encounter a full region during any insert. Obviously, a "bad distribution" is one where several full regions occur contiguously, resulting in the requirement for a number of moves in order to provide a hole to support an insertion.

A good TCAM update algorithm will thus try to ensure that if one starts with a good distribution of holes among the regions, then after several updates the hole distribution will remain good. The naïve algorithm unfortunately gets stuck in a bad distribution once it reaches that state and never recovers on its own. If k full regions occur contiguously at any point, then the naïve algorithm incurs an average cost of k/2 moves for every future insert into one of those regions. For example, if the lowest-addressed (bottom-most) one third of the prefix regions in the TCAM increase in size by 10%, they will borrow holes from the middle third. This can result in a complete lack of holes in the middle region, which is too large for a naïve algorithm to compensate. This cost results in a packet processing delay, which can in turn cause packet drops.

A study of the problem has indicated that a good TCAM update algorithm has the following desirable properties: (a) Given a good distribution of holes among regions, the distribution should tend to remain good after several updates; and (b) Even if the TCAM is forced into a bad distribution, the update algorithm should automatically recover to a good distribution with future updates.

Another basic problem with the prior art naïve algorithm is that, even if there are holes within a region available for insert, one still needs to search for them, again incurring undesirable delays. Because these holes may be scattered throughout the region, finding one can become an expensive task in terms of processor resources. There are presently two approaches commonly used in such situations. On the one hand, one could go through the entire region looking for available holes. This method is time consuming and thus could lead to packet drops. Alternately, one could maintain a doubly-linked list of holes for each region in storage device external to the TCAM and use that data structure to locate a hole. Though this approach allows one to locate a hole in a constant amount of time (independent of the size of the region, number of holes, and the number of regions, a period represented in algorithmic analysis literature as order-1 or "O(1)" time complexity), it requires maintaining complicated data structures in the TCAM controller. Any hardware or firmware implementation of the TCAM controller would thus consume additional (and scarce) memory and code space resources.

What is needed is an efficient algorithm for TCAM updates and an associated TCAM organization scheme that enables rapid location and utilization of holes in a given region of the memory.

SUMMARY

Presently described are techniques for the efficient location of free entries or "holes" for use in performing insert operations in a binary or ternary content addressable memory. TCAMs, as used in data communications and packet routing, often rely on an organization that maintains entries of the same "length" within defined regions. The present invention keeps the holes (that is, the memory locations within the TCAM that have no data written into them) compacted into a contiguous subregion within each region. Advantageously, this compaction does not require movement of the holes during a delete operation. The present invention has the further advantage of keeping all of the holes sorted by TCAM region. These positive effects are accomplished by initially pre-filling the entire memory with a set of hole codes that uniquely identify the holes in each region.

After the memory is initialized, a conventional memory write is performed to put the initial state of the routing data into the memory. Typically, such routing data will not fill the entire memory, leaving unused entries (containing the region-unique hole code) in each region.

In operation, as entries need to be added or deleted, the present invention provides a rapid and efficient mechanism whereby entries to be deleted can be simply replaced by the region-unique hole code. Likewise, to insert data in an entry, the host processor simply needs to search for a hole code in the region of interest. In instances where a region has no available holes, a simple mechanism is presented to allow movement of a hole from a nearby region. Anytime a hole is created within the "used" subregion of a region, that hole (being the top-most hole in the region) will be the first to be filled on a subsequent insertion. Accordingly, the used entries and the holes will each be kept in contiguous subregions within each region, providing an efficient usage of memory resources.

BRIEF DESCRIPTION OF THE DRAWINGS

The present disclosure may be better understood and its numerous features and advantages made apparent to those skilled in the art by referencing the accompanying drawings.

The use of the same reference symbols in different drawings indicates similar or identical items.

DETAILED DESCRIPTION

Overview

Figure 1:
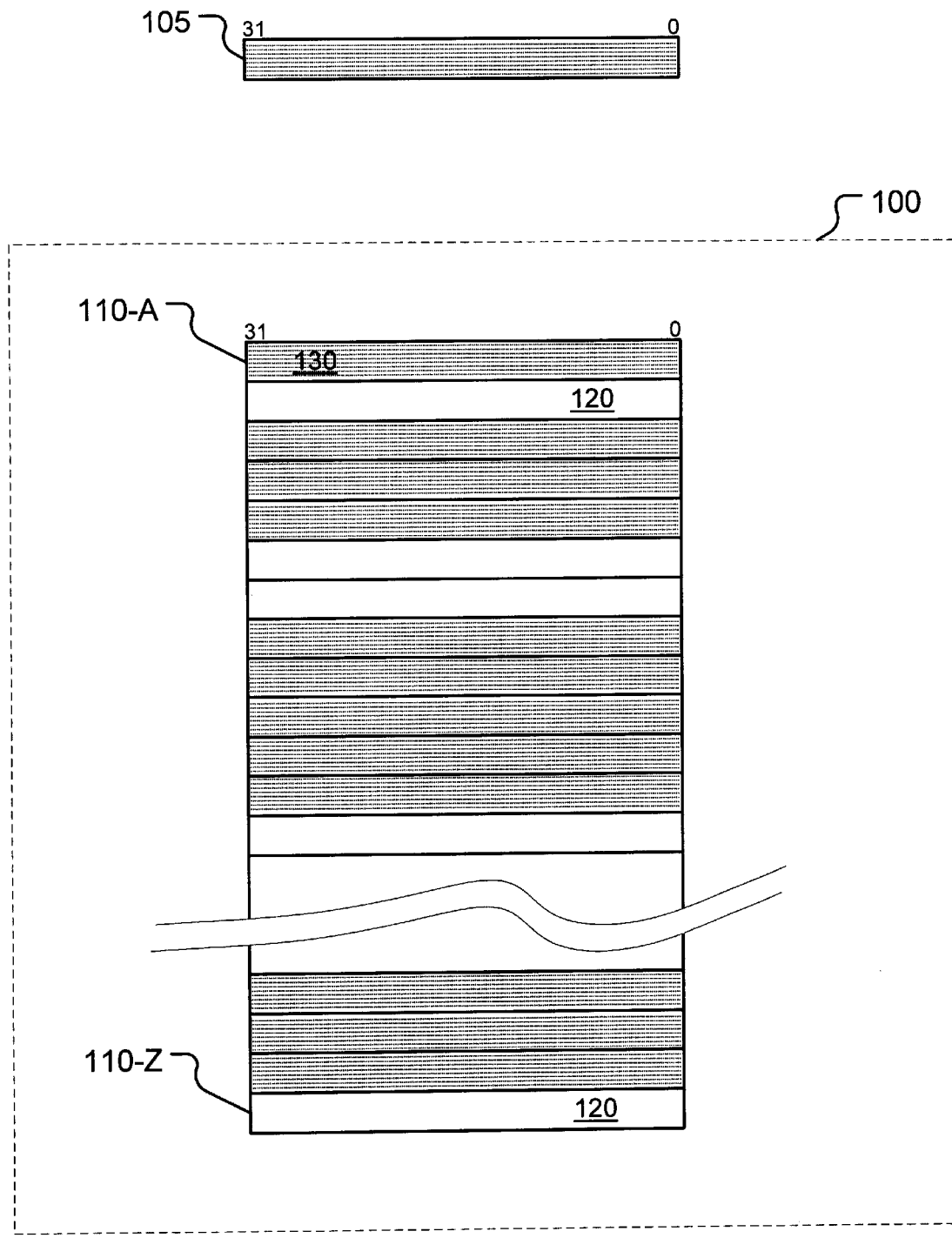
FIG. 1 illustrates the structure of a part of a prior art IP prefix table implemented within a TCAM.
Figure 2:
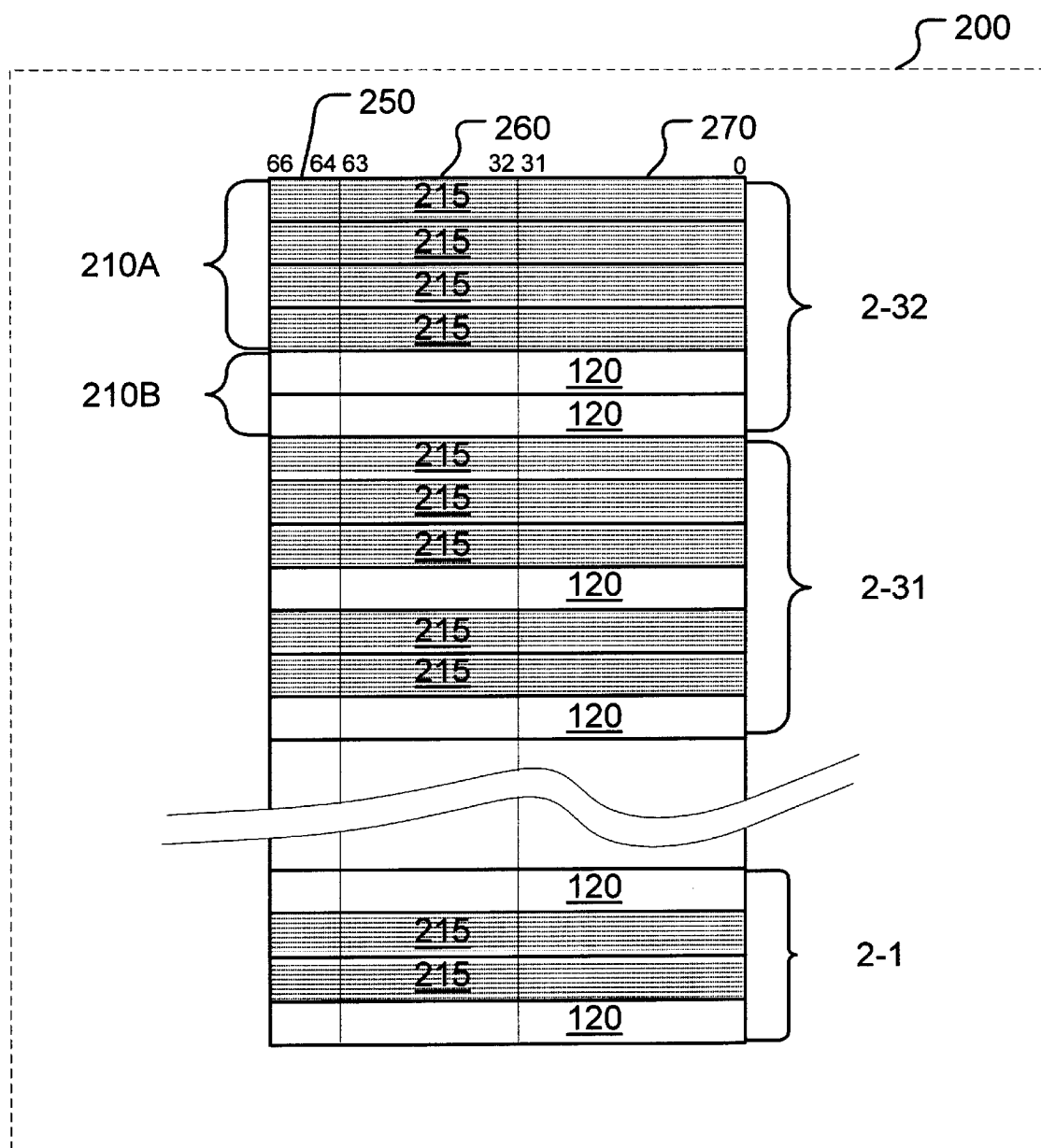
FIG. 2 illustrates a structure of a part of an IP prefix table implemented according to one embodiment of the present invention.

FIG. 2 illustrates an organization of the entries in a TCAM 200 according to one embodiment of the present invention. In particular, the holes 120 within each prefix length region 2 are kept compacted in a single subregion, e.g., subregion 210B. This compaction does not require movements of holes during the delete operation, so it has the advantage of keeping each region compacted without any movement costs. Furthermore, the present invention keeps the list of free entries (holes) automatically sorted by TCAM region;

no external free entry list or stack is required. This latter advantage is realized through the use of the particular free entry coding scheme of the present invention, as will be explained in more detail below.

The invention operates by pre-filling each entry in each region 2 of the TCAM with a different pattern or "hole code" that is unique to each region and consistent within each region. In one embodiment of the present invention, the pattern begins with three class bits 250 set to 000, although the class bits are not essential to the operation. The pattern used in each entry is as follows, described in [class bit 250, TCAM value 260, TCAM mask 270] format.

| Class bits 250 | TCAM Value 260 (32 bits) | TCAM Mask 270 (32 bits) | Region |
|---|---|---|---|
| 000 | 1111 ... 1110 | 1111 ... 1111 | 32 |
| 000 | 1111 ... 1100 | 1111 ... 1110 | 31 |
| 000 | 1111 ... 1000 | 1111 ... 1100 | 30 |
| 000 | ... | ... | ... |

In general, the hole code for each TCAM region I is described by the following formula:

Hole Code$_I$=[000, {(I−1)ONEs, (32−(I−1))ZEROs}, {(I)ONEs, (32−I)ZEROs}]

The pattern for the topmost region 32 thus consists of three class bits 250 set to ZERO followed by 31 ONEs and a ZERO in the TCAM Value field 260, then 32 ONEs in the TCAM Mask field 270. The pattern consisting of all ONE's is reserved for 64 bit entries. Note that each region's hole code (i.e., the pattern denoting a free entry 120 in a particular region 2) has a common subsequence with regions below it. In this way, when one region is full, a single lookup will also show us the next lower available entry, i.e., the first hole in a lower region. Any necessary movement of full entries can be done using this information alone.

After the CAM is pre-loaded with the above hole codes, denoting free entries in all locations (according to one embodiment of the present invention), the TCAM can be loaded (i.e., filled or otherwise programmed) with an initial set of prefix-sorted entries 215. This loading or filling is accomplished by conventional means well-known in the art and results in filling the upper subregion (i.e., the subregion having the higher relative address within a given region [for example, region 210A in FIG. 2], in one embodiment) of each region 2 with the appropriate, predefined routes needed by the system. For example, region 2-32 in TCAM table 200 is loaded in the format shown in FIG. 2: first a contiguous subregion 210A of one or more occupied (i.e., filled, programmed, used) entries 215, followed by a contiguous subregion 210B of one or more holes 120 each containing the hole code for region 2-32. (The exemplary configuration of a single subregion is shown by region 2-32 is used here for illustrative purposes only. Each region can have a similar organization and may or may not include holes.)

In operation, as entries are removed and added to the TCAM table, deletions and insertions are required. A deletion involves retrieving the address of the entry that is to be deleted and writing the hole code for that particular region to that address. No lookup is required because the CPU and/or TCAM controller maintains a directory of the addresses into which it has written entries 215 as part of its regular housekeeping activities.

One will note that such a deletion can create a hole in the middle of the used entry area of the TCAM table 200, as illustrated in region 2-31. However, as will be seen below, the very next insert into that region will immediately return the address of the mid-region hole and it will be filled without leaving any inefficient gaps in the region.

When new entries need to be placed into the table, as encountered in many common scenarios seen in the art today, the insertion is provided by first conducting a lookup to find the top-most free location in the region of interest, i.e., the one closest to the upper bound of the region and immediately adjacent to (if not inside) the used entry sub-region. This is easily accomplished because the region is known from the prefix length of the entry to be inserted. Given the region number, a lookup key containing the region number and the hole code specific to that region is easily formed. A subsequent TCAM lookup using that key returns the address of the highest free location in the particular region. The address of the free location enables a conventional write function to perform the insert.

On occasion, the system may find itself running out of free entries in a particular region. The status and availability of free entries is continually monitored by the system CPU or TCAM control processor, which is programmed by conventional means to keep track of the addresses of the region boundaries and maintain a set of counters to track the number of free entries remaining in each region. Each counter is incremented or decremented upon each deletion or write (respectively) in its corresponding region. Programming necessary to provide these functions is well-within the skill of one of ordinary skill in these arts; accordingly, it will not be further discussed herein.

Figure 8:
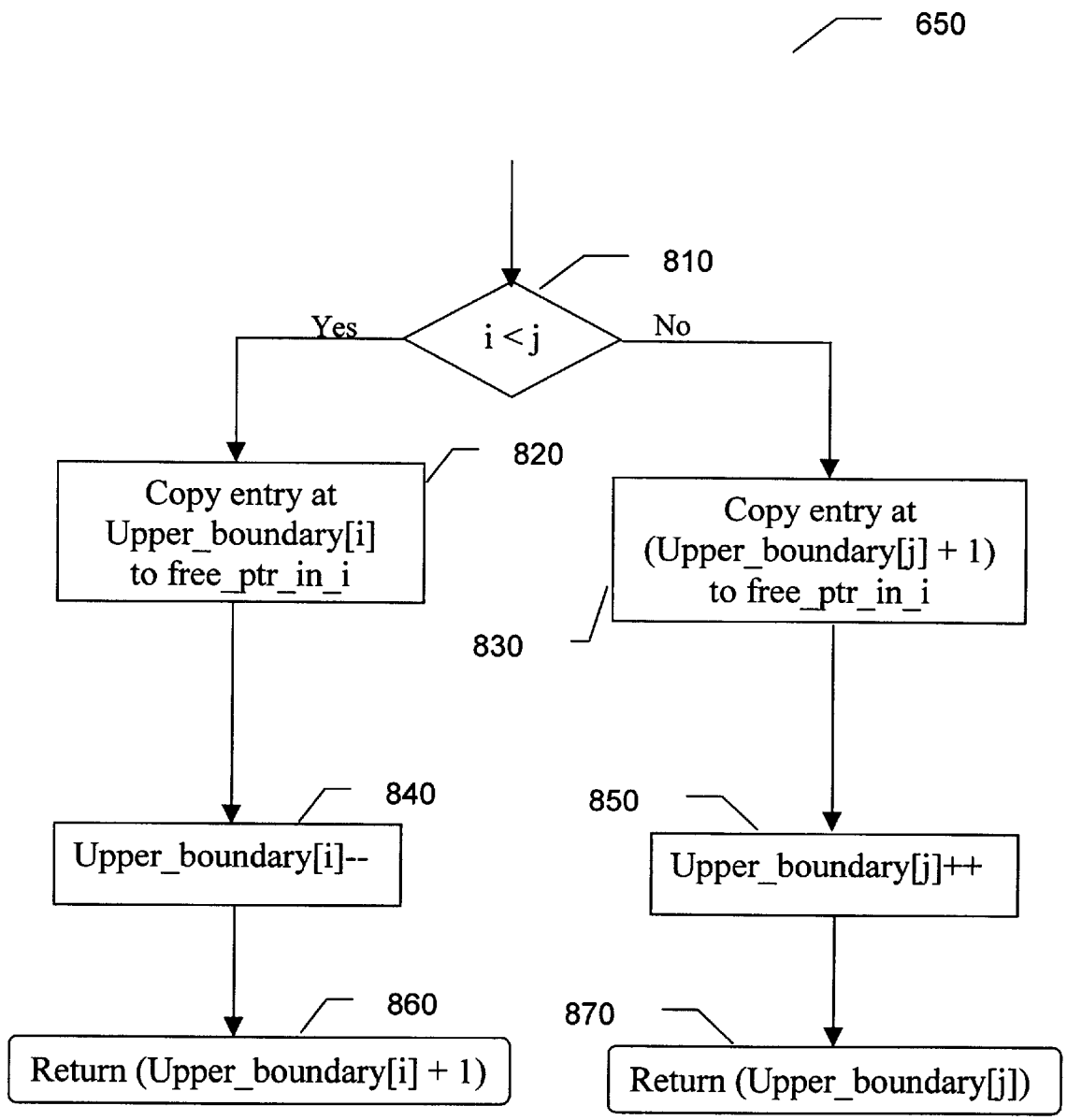
FIG. 8 is a flowchart of the Move procedure.

If an insert is required in a region that lacks holes, an ExpandRegion procedure is initiated to move a hole into the "congested" region. This particular move is accomplished, in one embodiment of the present invention, by the method discussed below with reference to FIGS. 5, 6, and 8.

Process Flow Charts

Figure 3:
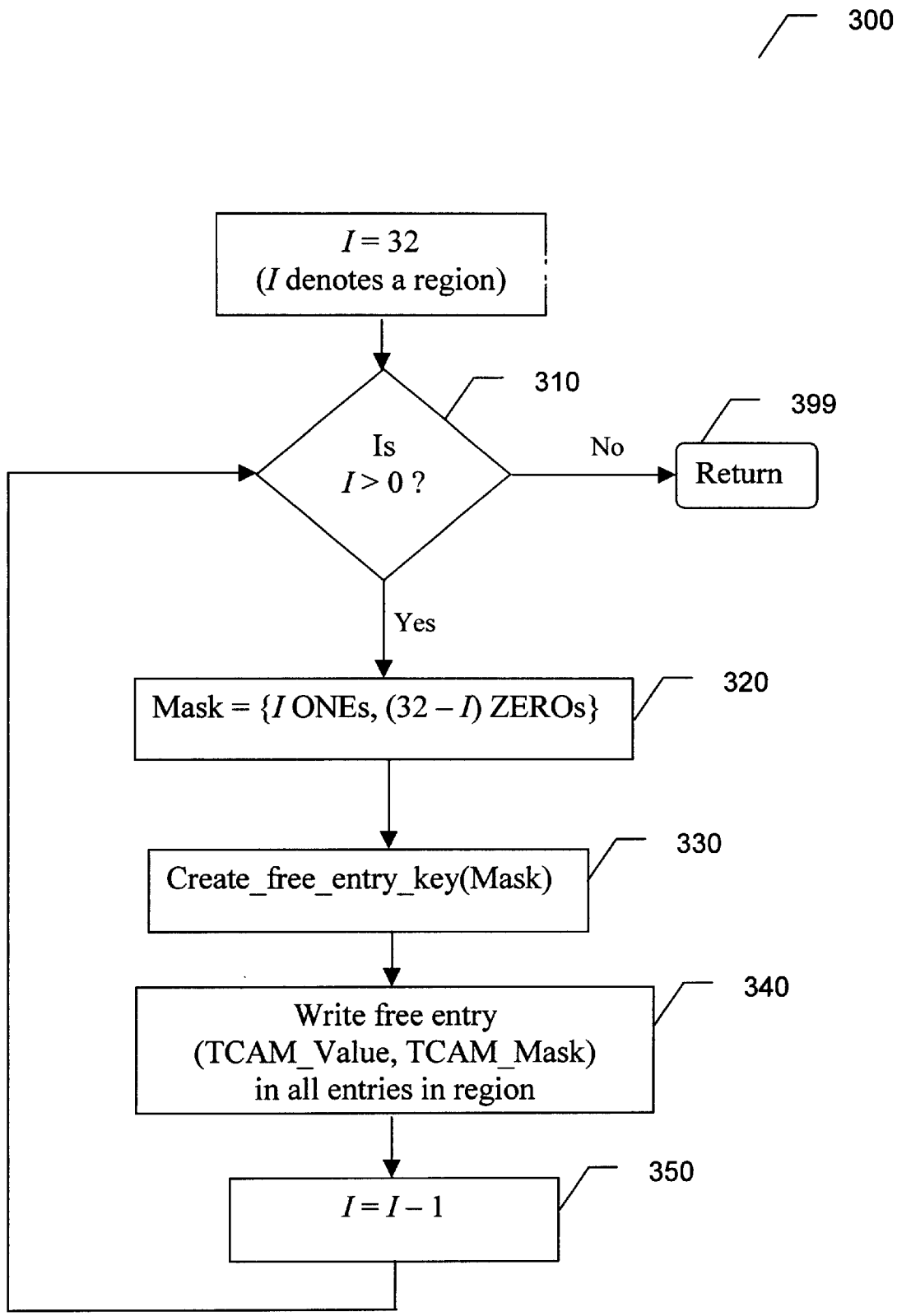
FIG. 3 is a flowchart of the initialization method according to one embodiment of the present invention.

FIG. 3 shows a top level view of initialization procedure 300 according to one embodiment of the present invention. The initialization process begins by setting a variable I equal to the number of regions within the TCAM. For Internet Protocol version 4 (IPv4) there are 32 regions, one region for each of the possible prefix lengths in the 32-bit address space of IPv4. In a system constructed to service Internet Protocol version 6 (IPv6) there are 128 regions, as IPv6 uses 128 bit addressing.

Process 300 begins with step 310, wherein the variable I holding number of regions is tested against a null value. If the I is less than or equal to 0, denoting an improperly initialized variable I, the process exits in step 399 to a wait state. This wait state, in some embodiments of the present invention, consists of a time wherein the TCAM controller is performing other conventional tasks. As is well-known in the art, such controller wait states last until the system program under which the switching or routing device operates instructs the TCAM to perform a command, such as initialization procedure 300.

Note: For simplicity, the machine performing the steps of the process flow charts is referred to here as the "TCAM controller." One of ordinary skill in the art will recognize that these steps could also be performed by the switch/router CPU, a general-purpose computer, custom-made hardware, or any combination of the above. Accordingly, though the term "TCAM controller" will be used throughout, the present invention will be understood to not be so limited in its scope.

If I is greater than 0 (i.e., test 310 is successful), the procedure proceeds to step 320. The variable Mask is then set equal to a string comprised of: {I ONEs, (32−1) ZEROs}.

Next, in step 330, the procedure calls subprocess 330 Create_free_entry_key(Mask). Subprocedure 330, which is explained in further detail in FIG. 4, initializes both the TCAM_Value and the corresponding TCAM_Mask for each entry in region I.

Process 300 then proceeds with step 340, which writes the free entry hole code of (TCAM_Value, TCAM_Mask) in all entries in region I. Variable I is then decremented by one in step 350 and the process loops to step 310.

Process 300 continues until all regions I in the TCAM are properly initialized with their region-unique hole codes, at which point (i.e., I=0), process 300 exits at step 399 to wait for a command from the TCAM controller.

Figure 4:
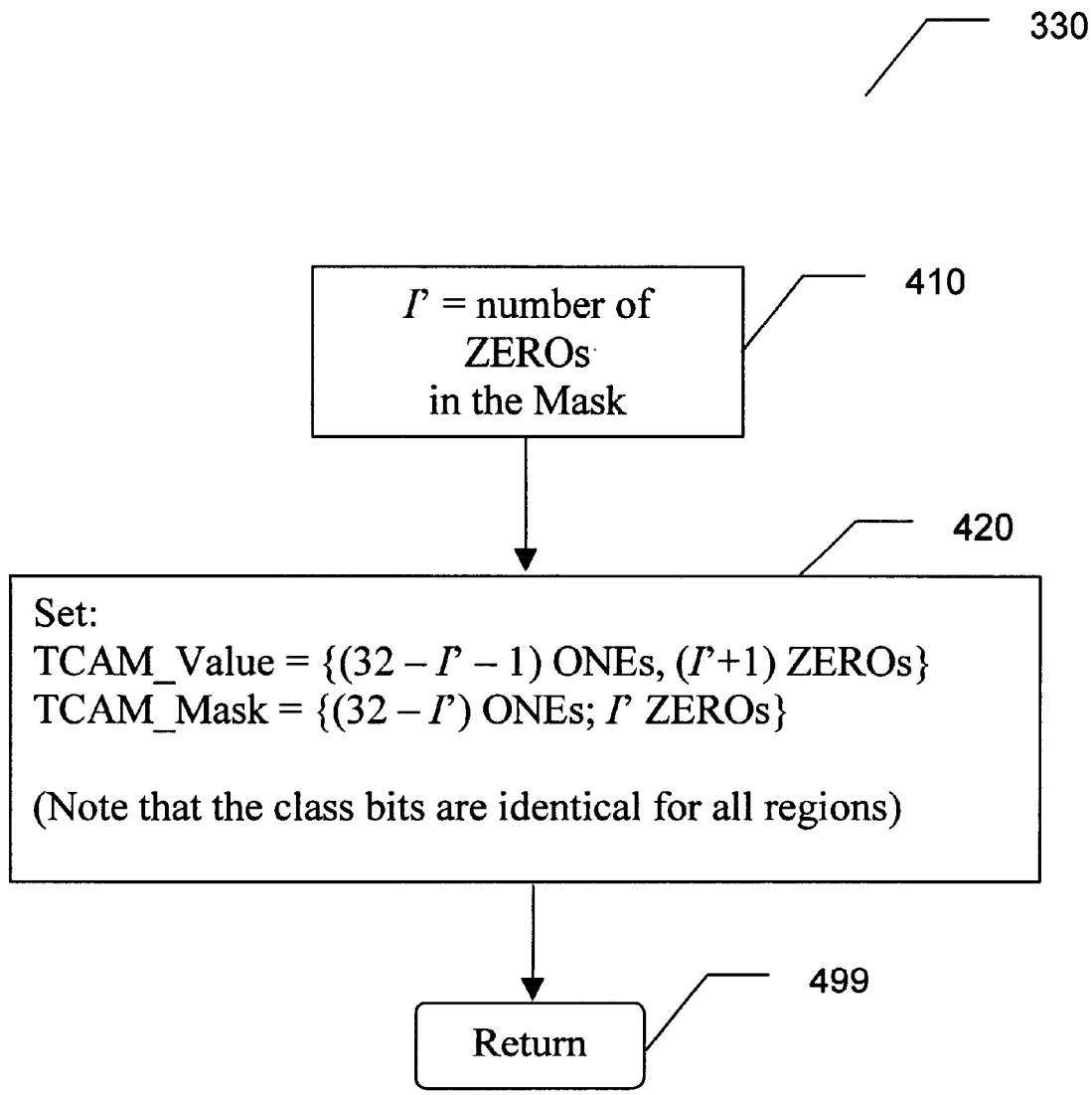
FIG. 4 is a flowchart of the Create_free_entry_key procedure.

FIG. 4 explains in greater detail the process of Create_free_entry_key(Mask) 330. In step 410, local variable I' holds the number of ZEROs in global variable Mask, as defined by initialization procedure 300 and passed into the Create_free_entry_key procedure.

In step 420, string variable TCAM_Value is set to {(32−1(I'−1)) ONEs, (I'+1) ZEROs}. Variable TCAM_Mask is set to {(32−I') ONEs, I' ZEROs}. Subprocedure 330 then returns to the calling initialization procedure 300 at step 499.

Figure 5:
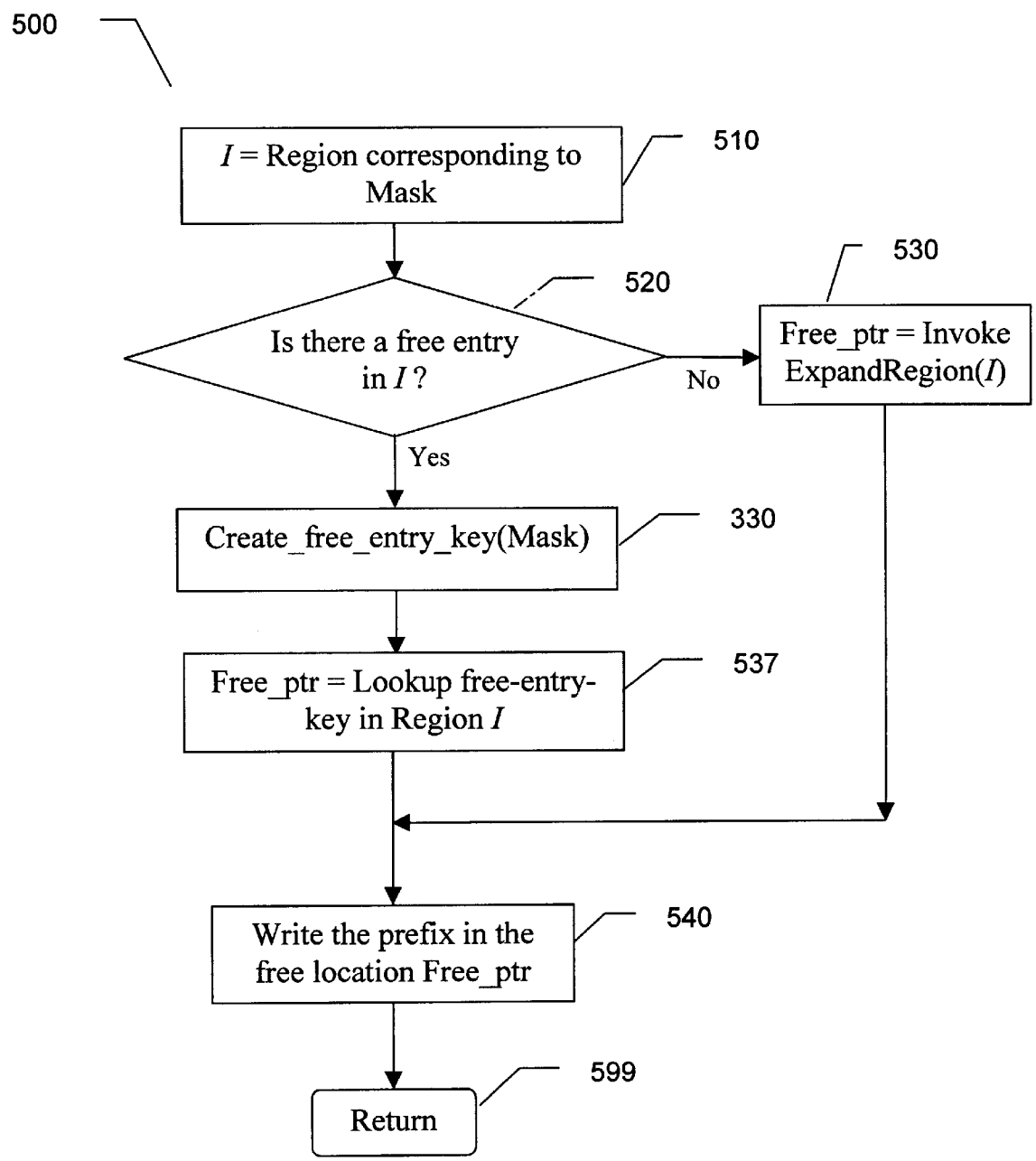
FIG. 5 is a flowchart of the Insert procedure.

FIG. 5 shows Insert procedure 500, which is called when the TCAM controller determines that a new entry (containing a route prefix) must be inserted into the TCAM. The variables Key and Mask appropriate to the target region are passed into procedure 500 on invocation.

In step 510, the value or Mask is used to determine the region of interest I by direct inspection. Since there are (32−I) ZEROs in Mask, (32−number of zeros)=I. A check of the hole counter for region I is performed in step 520. If there are holes left, the free entry key is created, step 330. A lookup performed using the free entry key then defines a pointer (free_ptr) to the available hole in step 537. The insert is completed by write 540 and terminates at return 599.

If, however, there are no free entries in region I, subprocedure ExpandRegion 530 is invoked. As will be seen shortly, Expand Region returns a pointer to the "new" hole, free_ptr.

Figure 6:
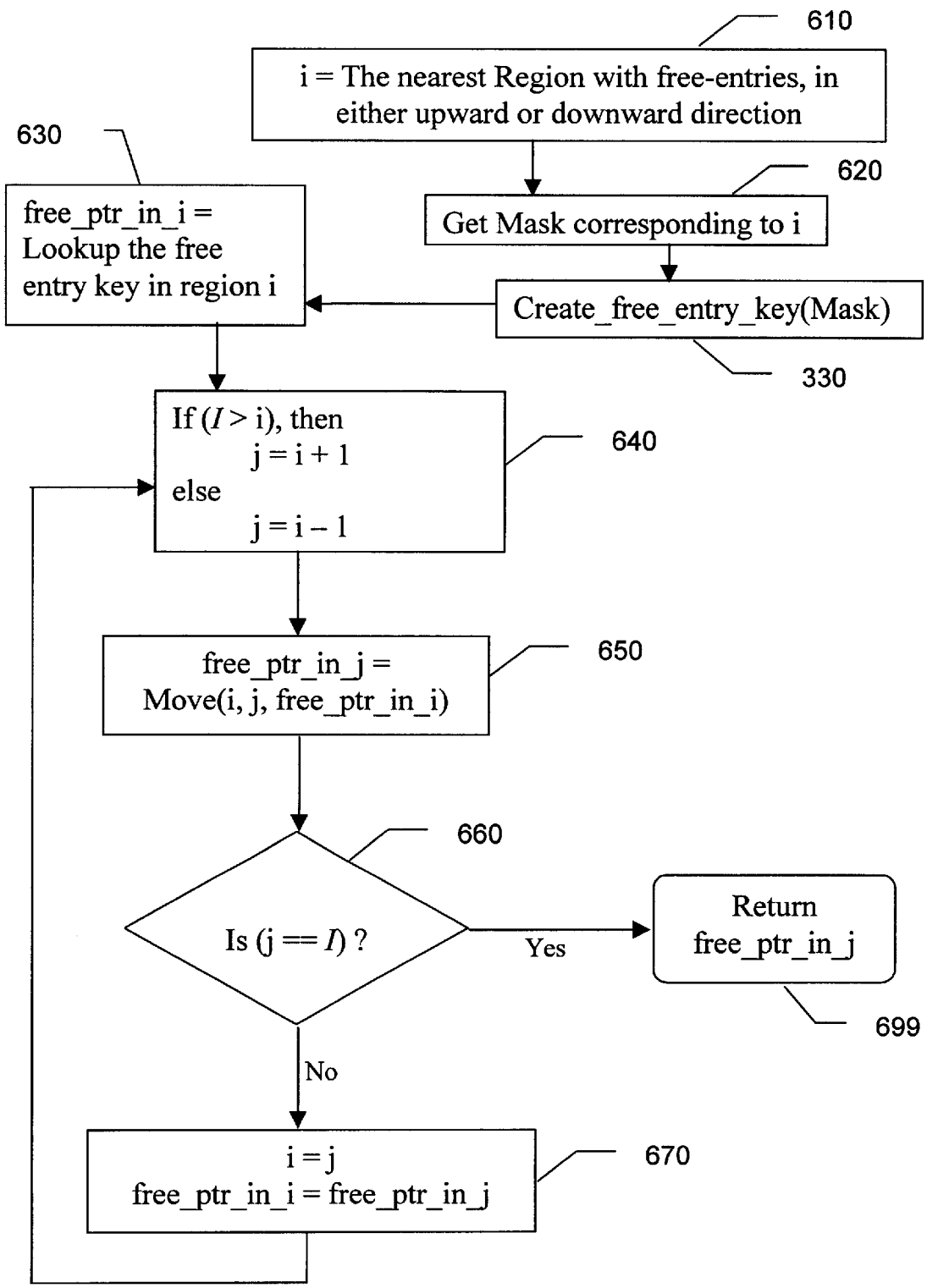
FIG. 6 is a flowchart of the Expand Region procedure.

Step 530 is further explained in FIG. 6. In order to expand the free entries available in a given region, sub-procedure 530 finds the nearest region with free entries in either the upward or the downward direction (in one embodiment of the present invention) in step 610. This is readily done by checking the hole counters for the regions closest to the region of interest, in both the upward and downward directions.

The hole counters must be scanned both above and below the region of interest because a simple lookup of the hole code for a region will only return a free pointer to a hole in that region or below it. This is so because the hole codes below the region of interest I are substrings of the I-region hole code. For example, if there are holes in region I+1 and I−3, only a free_ptr to the latter (I−3) would be returned by a lookup. In reality, the hole above (in region I+1) is closer, so the necessary hole movement would be more efficiently accomplished from above (i.e., from region I+1) rather than below (from region I−3).

In step 620, the process next determines the Mask associated with the region of interest I, the congested region needing an additional hole. As in FIG. 3, Mask={I ONEs, (32−I) ZEROs}. The free entry search key is used to perform the lookup in region i, returning the free_tr_in_i indicating the address of the nearest hole.

Steps 640–670 are concerned with moving the hole found in i into the region that need it, region I. Conditional step 640 finds and determines if I is greater than i, indicating that the hole is below the region needing it. If so, counter j is set to i+1, the region above region i in the direction of the region needing the hole. Otherwise, the hole is above I, so j is set to i−1.

Move function 650 (explained with reference to FIG. 8) is then used to move the hole from region i to region j (towards region I in either case).

The hole movement is determined by whether the hole is above or below pointer j; in other words, by the direction in which the hole must be moved. If i<j (step 810), then the hole (i) is below j and thus, also below I.

To move the hole, one must first create a hole at the top of i. Step 820 accomplishes this by copying the contents of the entry at the upper boundary of i into the hole in region i and then decreasing the upper boundary pointer (step 840). This decrease has the effect of moving a now-free location into region i+1: Step 860 thus returns a pointer to the free location, free_ptr_in_j.

In the alternative result at step 810, the process proceeds analogously, but moving the hole downward from the lower limit of i into j, in steps 830, 850, and 870.

After returning from move sub-process 650, process 530 checks (step 660) to see if j=I, indicating that the hole has been moved into the region where it is needed. If so, the free_ptr_in_j, which points to the hole, is returned to the Insert procedure at step 530. If not, i is set equal to j and the free_ptr_in_j copied into free_ptr_in_i to allow iteration from step 670 to step 640. This loop continues until test 660 is successful, meaning the hole has been moved from j to i enough times that it has arrived in I.

Figure 7:
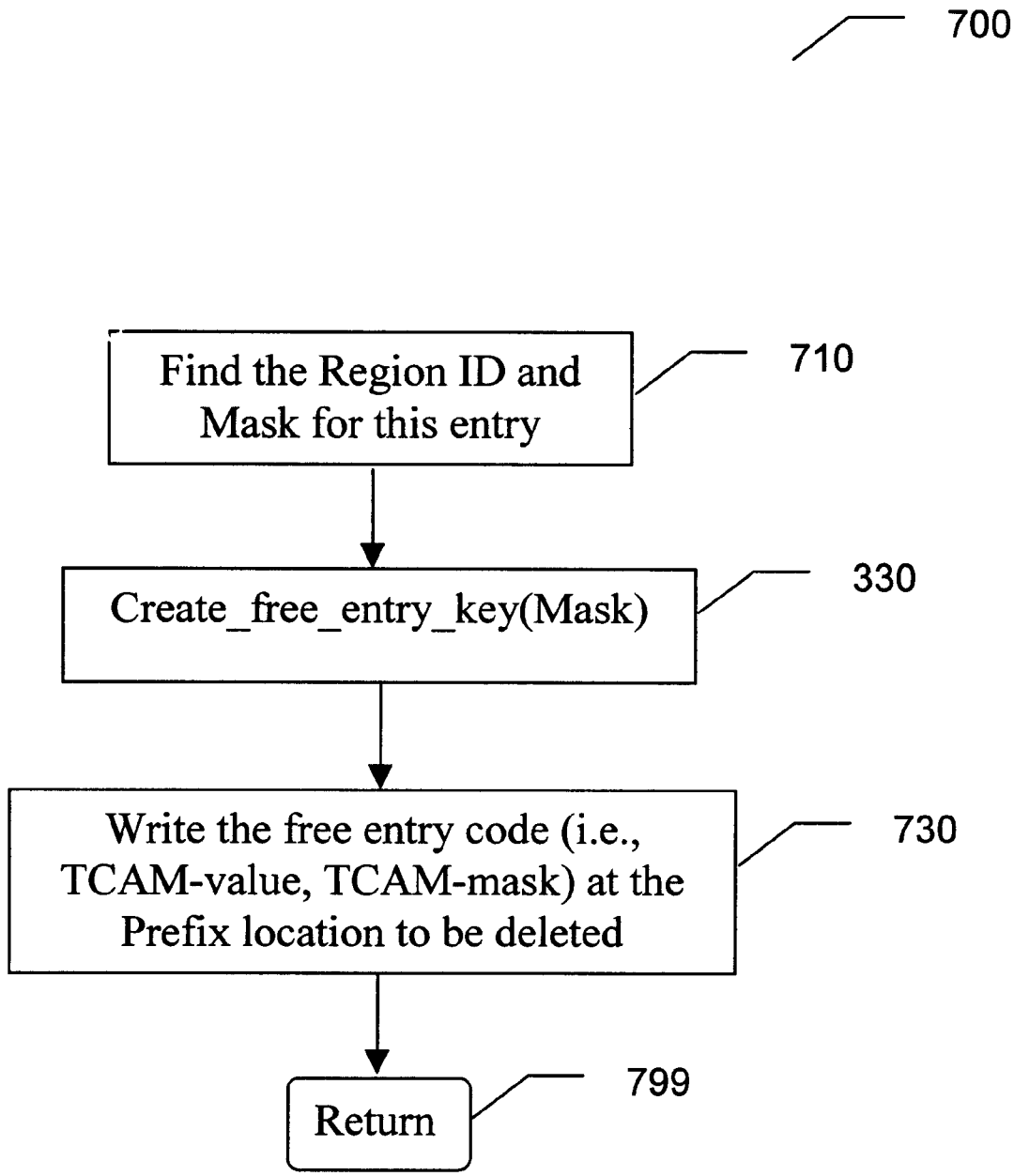
FIG. 7 is a flowchart of Delete procedure.

FIG. 7 shows the procedure invoked when a command to delete an entry present in the TCAM table is received. First, in step 710, the region ID and Mask corresponding to the entry to be deleted is determined by the TCAM controller. Next, in step 330, subprocedure Create_free_entry_key (Mask) is invoked as described with FIGS. 3 and 4.

The resulting free entry key (i.e., the TCAM_Value and TCAM_Mask determined by subprocedure 310), which is the hole code for the region of interest, is written (step 370) into the TCAM at the prefix location to be deleted. As noted above, the prefix location is known a priori to the TCAM controller, because it keeps track of the addresses of each prefix written into the TCAM.

Finally, in step 799, procedure 700 returns to the wait state to await further commands from the TCAM controller or system processor, as the case may be.

Alternate Embodiments

The order in which the steps of the present methods are performed is purely illustrative in nature. In fact, the steps can be performed in any order or in parallel, unless otherwise indicated by the present disclosure.

The method of the present invention may be performed in either hardware, software, or any combination thereof, as those terms are currently known in the art. In particular, the present method may be carried out by software, firmware, or microcode operating on a computer or computers of any type. Additionally, software embodying the present invention may comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Furthermore, such software may also be in the form of a computer data signal embodied in a carrier wave, such as that found within the well-known Web pages transferred among computers connected to the Internet. Accordingly, the present invention is not limited to any particular platform, unless specifically stated otherwise in the present disclosure.

While particular embodiments of the present invention have been shown and described, it will be apparent to those skilled in the art that changes and modifications may be made without departing from this invention in its broader aspect and, therefore, the appended claims are to encompass within their scope all such changes and modifications as fall within the true spirit of this invention.

We claim:

1. A method of memory management comprising:
    dividing a memory into a plurality of contiguous regions, each said region composed of a plurality of entries;
    initializing each entry in each said region to a region-unique hole code; and
    when commanded:
        deleting one of said plurality of entries by overwriting said entry with said region-unique hole code; or
        inserting data into one of said plurality of entries, wherein said inserting further comprises:
            if a first region containing said entry in which said data is to be inserted lacks an entry containing said region-unique hole code, expanding said first region by moving an entry containing said region-unique hole code from another of said plurality of regions and resetting said region-unique hole code to the hole code appropriate to said first region; and
            overwriting the entry containing said region-unique hole code with said data.

2. The method of claim 1, wherein said memory comprises a content addressable memory (CAM).

3. The method of claim 1, wherein said memory comprises a ternary content addressable memory (TCAM).

4. The method of claim 1, wherein said expanding further comprises:
    identifying a nearest one of said plurality of regions (the "nearest region") containing an entry having stored therein a region-unique hole code (the "nearest hole");
    moving said nearest hole into said first region by iteratively:
        copying the contents of the entry at the region boundary of said nearest region (hereinafter the "boundary entry") into said nearest hole;
        moving the region boundary of said nearest region away from said first region;
        writing into the boundary entry the hole code of the next closer region to said first region;
    until said boundary entry is within said first region.

5. A computer system for memory management, comprising computer instructions for:
    dividing a memory into a plurality of contiguous regions, each said region composed of a plurality of entries;
    initializing each entry in each said region to a region-unique hole code; and
    when commanded:
        deleting one of said plurality of entries by overwriting said entry with said region-unique hole code; or
        inserting data into one of said plurality of entries, wherein said inserting further comprises:
            if a first region containing said entry in which said data is to be inserted lacks an entry containing said region-unique hole code, expanding said first region by moving an entry containing said region-unique hole code from another of said plurality of regions and resetting said region-unique hole code to the hole code appropriate to said first region; and
            overwriting the entry containing said region-unique hole code with said data.

6. The computer system of claim 5, wherein said memory comprises a content addressable memory (CAM).

7. The computer system of claim 5, wherein said memory comprises a ternary content addressable memory (TCAM).

8. The computer system of claim 5, wherein said expanding further comprises:
    identifying a nearest one of said plurality of regions (the "nearest region") containing an entry having stored therein a region-unique hole code (the "nearest hole");
    moving said nearest hole into said first region by iteratively:
        copying the contents of the entry at the region boundary of said nearest region (hereinafter the "boundary entry") into said nearest hole;
        moving the region boundary of said nearest region away from said first region;
        writing into the boundary entry the hole code of the next closer region to said first region;
    until said boundary entry is within said first region.

9. A computer system comprising a processor, a memory, and a network interface, said processor configured to perform the steps of:
    dividing a memory into a plurality of contiguous regions, each said region composed of a plurality of entries;
    initializing each entry in each said region to a region-unique hole code; and
    when commanded:
        deleting one of said plurality of entries by overwriting said entry with said region-unique hole code; or
        inserting data into one of said plurality of entries, wherein said inserting further comprises:
            if a first region containing said entry in which said data is to be inserted lacks an entry containing said region-unique hole code, expanding said first region by moving an entry containing said region-unique hole code from another of said plurality of regions and resetting said region-unique hole code to the hole code appropriate to said first region; and
            overwriting the entry containing said region-unique hole code with said data.

10. The computer system of claim 9, wherein said memory comprises a content addressable memory (CAM).

11. The computer system of claim 9, wherein said memory comprises a ternary content addressable memory (TCAM).

12. The computer system of claim 9, wherein said expanding further comprises:
    identifying a nearest one of said plurality of regions (the "nearest region") containing an entry having stored therein a region-unique hole code (the "nearest hole");
    moving said nearest hole into said first region by iteratively:
        copying the contents of the entry at the region boundary of said nearest region (hereinafter the "boundary entry") into said nearest hole;
        moving the region boundary of said nearest region away from said first region;
        writing into the boundary entry the hole code of the next closer region to said first region;
    until said boundary entry is within said first region.

13. A computer-readable storage medium, comprising computer instructions for:
    dividing a memory into a plurality of contiguous regions, each said region composed of a plurality of entries;

initializing each entry in each said region to a region-unique hole code; and when commanded:

deleting one of said plurality of entries by overwriting said entry with said region-unique hole code; or inserting data into one of said plurality of entries, wherein said inserting further comprises:

if a first region containing said entry in which said data is to be inserted lacks an entry containing said region-unique hole code, expanding said first region by moving an entry containing said region-unique hole code from another of said plurality of regions and resetting said region-unique hole code to the hole code appropriate to said first region; and overwriting the entry containing said region-unique hole code with said data.

14. The computer-readable storage medium of claim 13, wherein said memory comprises a content addressable memory (CAM).

15. The computer-readable storage medium of claim 13, wherein said memory comprises a ternary content addressable memory (TCAM).

16. The computer-readable storage medium of claim 13, wherein said expanding further comprises:

identifying a nearest one of said plurality of regions (the "nearest region") containing an entry having stored therein a region-unique hole code (the "nearest hole");

moving said nearest hole into said first region by iteratively:

copying the contents of the entry at the region boundary of said nearest region (hereinafter the "boundary entry") into said nearest hole;

moving the region boundary of said nearest region away from said first region;

writing into the boundary entry the hole code of the next closer region to said first region;

until said boundary entry is within said first region.

17. A computer data signal embodied in a carrier wave, comprising computer instructions for:

dividing a memory into a plurality of contiguous regions, each said region composed of a plurality of entries;

initializing each entry in each said region to a region-unique hole code; and when commanded:

deleting one of said plurality of entries by overwriting said entry with said region-unique hole code; or inserting data into one of said plurality of entries, wherein said inserting further comprises:

if a first region containing said entry in which said data is to be inserted lacks an entry containing said region-unique hole code, expanding said first region by moving an entry containing said region-unique hole code from another of said plurality of regions and resetting said region-unique hole code to the hole code appropriate to said first region; and overwriting the entry containing said region-unique hole code with said data.

18. The computer data signal of claim 17, wherein said memory comprises a content addressable memory (CAM).

19. The computer data signal of claim 17, wherein said memory comprises a ternary content addressable memory (TCAM).

20. The computer data signal of claim 17, wherein said expanding further comprises:

identifying a nearest one of said plurality of regions (the "nearest region") containing an entry having stored therein a region-unique hole code (the "nearest hole");

moving said nearest hole into said first region by iteratively:

copying the contents of the entry at the region boundary of said nearest region (hereinafter the "boundary entry") into said nearest hole;

moving the region boundary of said nearest region away from said first region;

writing into the boundary entry the hole code of the next closer region to said first region;

until said boundary entry is within said first region.

21. A computer system for memory management, comprising:

means for dividing a memory into a plurality of contiguous regions, each said region composed of a plurality of entries;

means for initializing each entry in each said region to a region-unique hole code; and when commanded:

means for deleting one of said plurality of entries by overwriting said entry with said region-unique hole code; or means for inserting data into one of said plurality of entries, wherein said inserting further comprises:

if a first region containing said entry in which said data is to be inserted lacks an entry containing said region-unique hole code, means for expanding said first region by moving an entry containing said region-unique hole code from another of said plurality of regions and resetting said region-unique hole code to the hole code appropriate to said first region; and means for overwriting the entry containing said region-unique hole code with said data.

22. The computer system of claim 21, wherein said memory comprises a content addressable memory (CAM).

23. The computer system of claim 21, wherein said memory comprises a ternary content addressable memory (TCAM).

24. The computer system of claim 21, wherein said means for expanding further comprises:

means for identifying a nearest one of said plurality of regions (the "nearest region") containing an entry having stored therein a region-unique hole code (the "nearest hole");

means for moving said nearest hole into said first region by iteratively:

copying the contents of the entry at the region boundary of said nearest region (hereinafter the "boundary entry") into said nearest hole;

moving the region boundary of said nearest region away from said first region;

writing into the boundary entry the hole code of the next closer region to said first region;

until said boundary entry is within said first region.

* * * * *